(12) United States Patent
Shin et al.

(10) Patent No.: US 8,194,473 B2
(45) Date of Patent: Jun. 5, 2012

(54) NON-VOLATILE SEMICONDUCTOR MEMORY CIRCUIT

(75) Inventors: Yoon Jae Shin, Gyeonggi-do (KR); Dong Keun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 408 days.

(21) Appl. No.: 12/494,555

(22) Filed: Jun. 30, 2009

(65) Prior Publication Data
US 2010/0259974 A1  Oct. 14, 2010

(30) Foreign Application Priority Data
Apr. 14, 2009 (KR) .................. 10-2009-0032315

(51) Int. Cl.
*G11C 7/06* (2006.01)

(52) U.S. Cl. ......... 365/189.07; 365/189.05; 365/189.06; 365/230.08

(58) Field of Classification Search ............. 365/189.07, 365/189.05, 189.06, 230.08
See application file for complete search history.

(56) References Cited

U.S. PATENT DOCUMENTS

| | | | | |
|---|---|---|---|---|
| 6,094,374 | A * | 7/2000 | Sudo | 365/185.22 |
| 7,210,012 | B2 * | 4/2007 | Lee et al. | 711/163 |
| 7,639,522 | B2 * | 12/2009 | Cho et al. | 365/148 |
| 7,969,798 | B2 * | 6/2011 | Hwang et al. | 365/189.09 |
| 2009/0043973 | A1 | 2/2009 | Kang et al. | |
| 2009/0097336 | A1 | 4/2009 | Kang et al. | |

FOREIGN PATENT DOCUMENTS

| | | |
|---|---|---|
| KP | 10-0764738 B1 | 10/2007 |
| KR | 1020080062714 A | 7/2008 |

* cited by examiner

*Primary Examiner* — Pho M Luu
(74) *Attorney, Agent, or Firm* — Ladas & Parry LLP

(57) ABSTRACT

A non-volatile semiconductor memory circuit includes a memory cell array, and a verification sense amplifier controller configured to control switching devices, which receive external input data, depending on a level of the input data such that distribution voltage is changed when controlling a write operation by comparing the input data with cell data written in the memory cell array so as to provide cell data.

32 Claims, 4 Drawing Sheets

NON-VOLATILE SEMICONDUCTOR MEMORY CIRCUIT

CROSS-REFERENCES TO RELATED APPLICATION

The present application claims priority under 35 U.S.C. 119(a) to Korean application number 10-2009-0032315, filed on Apr. 14, 2009, in the Korean Intellectual Property Office, which is incorporated by reference in its entirety as if set forth in full.

BACKGROUND OF THE INVENTION

Embodiments of the present invention relate generally to a non-volatile semiconductor memory circuit, and more particularly, to a non-volatile semiconductor memory circuit capable of improving a read margin.

Recently, phase change random access memory (PRAM) has been spotlighted as a non-volatile memory. The PRAM has been studied and developed because while the PRAM is non-volatile, the PRAM allows random data access. Accordingly, the PRAM is applied to various semiconductor systems and semiconductor memory devices.

A unit cell of the PRAM includes a cell transistor connected to a word line and a variable resistor, such as germanium antimony telluride (GST), which is connected to a bit line. The GST is a phase change material, such as a calcogenide (e.g. $Ge_2Sb_2Te_5$) alloy having a thin thickness. That is, the GST is capable of having and changing between more than one material state. The GST has a high resistance in an amorphous state and a low resistance in a crystalline state. Using this aspect of the PRAM, data can be stored in a memory cell by using the two physical states of the GST based on the resistance difference in the GST.

FIG. 1 is a graph showing a voltage distribution of PRAM data.

Referring to FIG. 1, in the case of a single level cell, data can be classified into two types based on sensing voltage of a read operation, e.g., single reference voltage 'VREF'. In detail, if data can be read at the reference voltage 'VREF', the data may be referred to as reset state data, that is, data of '1'. However, if the data can not be read at the reference voltage 'VREF', the data may be referred to as set state data, that is, data of '0'. In terms of resistance, if the GST has a high resistance, the data refers to data of '1'. However, if the GST has a low resistance, the data refers to data of '0'.

The phase of the GST in the PRAM is changed due to Joule heating caused by an application of an external electrical pulse. The phase of the GST in the PRAM can be controlled by using the electrical pulse through a process that will be referred to as a "set/reset" operation.

As described above, when the state of the data of the GST is controlled due to heat caused by a pulse current, if a heat change occurs, the resistivity of the GST is changed. Thus, resistance of each memory cell is distributed in a wide range, and a read margin between the crystalline state and the non-crystalline state may be reduced, causing deterioration of reliability of the PRAM cell.

SUMMARY

A phase changeable memory device for a non-volatile semiconductor memory circuit improving a read margin is described herein.

According to one aspect, a non-volatile semiconductor memory circuit includes a memory cell array, and a verification sense amplifier controller configured to control switching devices, which receive external input data, depending on a level of the input data such that distribution voltage is changed when controlling a write operation by comparing the input data with cell data written in the memory cell array, thereby providing cell data, wherein the switching devices be selected differently according to the level of the input data.

According to another aspect, a non-volatile semiconductor memory circuit includes a memory cell array including a phase change random access memory (PRAM) cell, a verification sense amplifier controller configured to adjust predetermined voltage from voltage of an input/output line connected with the memory cell array, thereby providing cell data, and a verification sense amplifier configured to sense a level of the cell data which varies depending on current applied to the memory cell in a write mode. A voltage distribution rate of the predetermined voltage of the verification sense amplifier controller is directly adjusted according to a level of external input data.

According to another aspect, a non-volatile semiconductor memory circuit includes a memory cell array, and a write controller configured to compare external input data with sensing data and verify the input data and sensing data while varying input low voltage and input high voltage of cell data, which is written in the memory cell array, depending on a level of the external input data, which serves as a target level.

According to another aspect, a non-volatile semiconductor memory circuit includes a memory cell array, and a write controller configured to vary voltage of cell data by adjusting distribution voltage depending on a level of the input data when controlling a write operation by comparing external input data with cell data written in the memory cell array.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to an embodiment of the present invention, in a non-volatile semiconductor memory circuit an amount of electric current applied to the memory circuit is controlled depending on a set state and a reset state of data, so a range falling between the set state and the reset state is expanded resulting in an improvement of a read margin. Consequently, the reliability of the non-volatile semiconductor memory circuit is improved.

Figure 1:
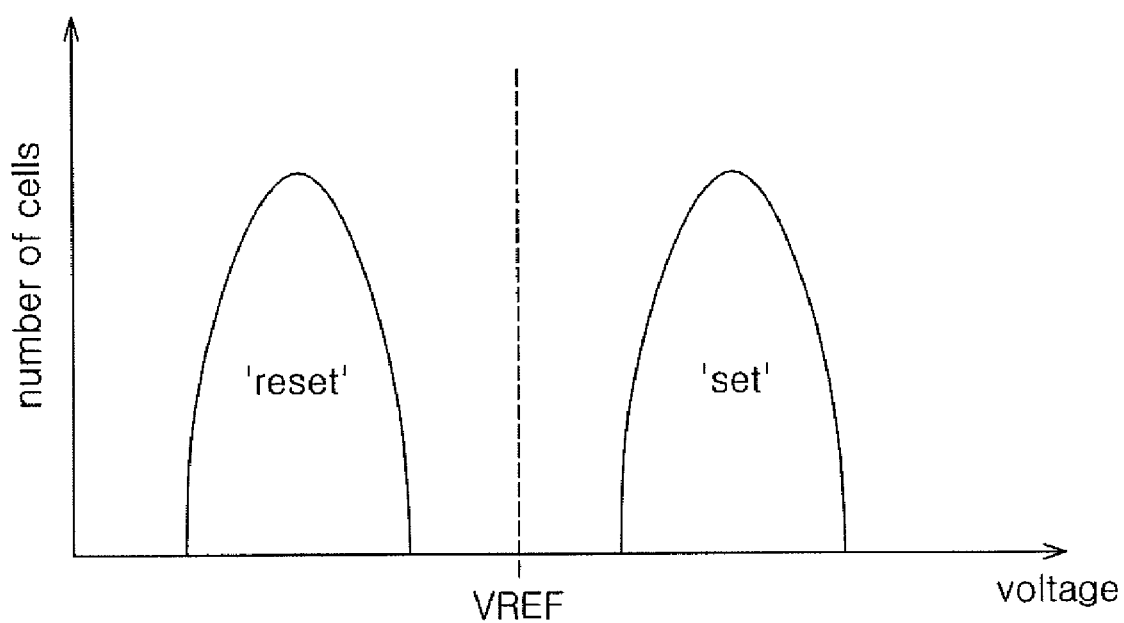
FIG. 1 is a graph showing voltage distribution of a general phase change memory cell.
Figure 2:
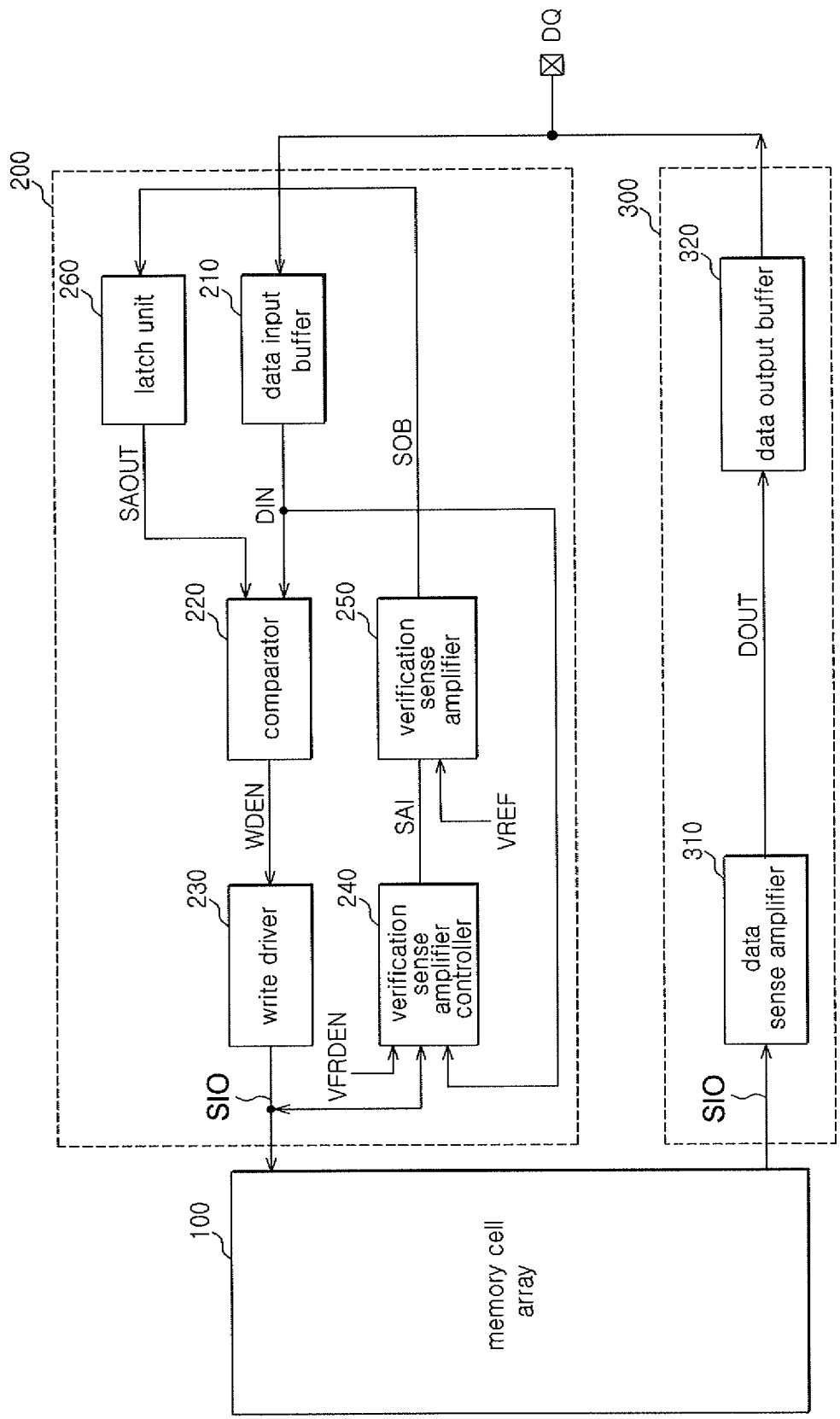
FIG. 2 is a block diagram of a non-volatile semiconductor memory circuit according to one embodiment of the present invention.

FIG. 2 is a block diagram showing an example of a non-volatile semiconductor memory circuit according to an embodiment of the present invention.

Referring to FIG. 2, the non-volatile semiconductor memory circuit can include a memory cell array 100, a write controller 200, and a read controller 300.

The memory cell array 100 can include a plurality of PRAM cells, each of which can include a switching device (e.g., a diode) connected to a word line (not shown) and a GST connected to a bit line (not shown).

In a write operation when the PRAM cell to be in a reset or set state, a write current must be applied to the PRAM cell for a long time (e.g. 100 ns). Further, when the write current is simultaneously applied to a multi-bit cell, a greater amount of current is required. In order to reduce current consumption during the write operation when the write operation is performed, a predetermined amount of write current (corresponding to a write voltage pulse) is applied to a memory cell, and the amount of the write current is reduced or increased according to whether data has been previously written in the cell. That is, when the write operation is performed, the data of a predetermined cell is read, and the write current is provided only after verifying whether the read data coincides with data to be written. As described above, an operation of reading data for the write operation will be referred to as a 'verification read operation'. According to the present invention, the non-volatile semiconductor memory circuit, which performs the 'verification read operation' in a write mode, will be described.

According to an embodiment of the present invention the write controller 200 can be configured to provide the write current to the PRAM cell according to the data (i.e. input data 'DIN') to be written by varying the amount of the write current, thereby controlling resistance distribution of the PRAM cell.

According to an embodiment of the present invention, a data input buffer 210 of the write controller 200 may be configured to buffer data provided from an external input/output pad DQ to provide the input data 'DIN'.

A comparator 220 of the write controller 200 can be configured to compare the input data 'DIN' with an output signal of a latch unit 260 of the write controller 200 (i.e. a sense amplifier output signal 'SAOUT'), so as to provide a write driving signal 'WDEN'. The latch unit 260 can be configured to latch sensing data 'SOB' which is an output signal of a verification sense amplifier 250 of the write controller 200. In more detail, the comparator 220 can be configured to compare the input data 'DIN', which is to be written in the memory cell array 100, with the sensing data 'SOB' read from the verification sense amplifier 250, so as to determine whether to drive a write driver 230 of the write controller 200. That is, if a level of the input data 'DIN' coincides with a level of the sensing data 'SOB', the comparator 220 provides the write driving signal 'WDEN' which is deactivated, i.e., not enabled. On the other hand, if the level of the input data 'DIN' does not coincide with the level of the sensing data 'SOB', the comparator 220 provides the write driving signal 'WDEN' which is activated, i.e., enabled.

The write driver 230 can be configured to load the input data 'DIN' on an input/output line 'SIO' such that the input data 'DIN' can be written in the memory cell array 100. The write driver 230 is driven in response to the write driving signal 'WDEN'. According to an embodiment of the present invention, the write driver 230 is driven in response to the write driving signal 'WDEN' when the write driving signal 'WDEN' is activated, and the write driver 230 is not driven when the write driving signal 'WDEN' which is deactivated. When the write driving signal 'WDEN' is deactivated, a verification sense amplifier controller 240 and the verification sense amplifier 250 are deactivated. The write driver 230 can be configured to apply a current to the memory cell array 100. That is, the write driver 230 can apply a constant voltage to the memory cell array 100, or the write driver 230 can apply a predetermined voltage to the memory cell array 100 while sequentially increasing or reducing the voltage. However it should be understood that the present invention is not limited thereto. For the purpose of convenience, the write driver 230 applies voltage through normal incremental step pulse programming (ISPP). For example, a voltage pulse step of the write driver 230 may be about 0.1V.

According to an embodiment of the present invention, the verification sense amplifier controller 240 can be configured to change a level of cell data 'SAI' by varying the amount of the write current provided to the memory cell array 100, according to the input data 'DIN' while the write driver 230 is being activated. The verification sense amplifier controller 240 can be configured to receive data of the input/output line 'SIO', a verification read signal 'VFRDEN', and the input data 'DIN' to provide the cell data 'SAI'. The verification sense amplifier controller 240 is described in greater detail below.

According to an embodiment of the present invention, the verification sense amplifier 250 can be configured to amplify voltage of the cell data 'SAI' using sensing reference voltage 'VREF', which serves as reference voltage of a read operation, to provide the sensing data 'SOB'.

That is, when the write current is applied to a predetermined memory cell, the verification sense amplifier 250 provides the sensing data 'SOB' by detecting a level (i.e. cell data 'SAI') of voltage which varies depending on through current provided to the predetermined memory cell.

Regarding the relation between the sensing reference voltage 'VREF' and the cell data 'SAI', the level of the sensing reference voltage 'VREF' is set to be lower than the level of the cell data 'SAI' in the reset state. Further, the level of the sensing reference voltage 'VREF' is set to be higher than the level of the cell data 'SAI' in the set state. Thus, the verification sense amplifier 250 can amplify the cell data 'SAI' in the reset state to output the sensing data 'SOB' having a high voltage level. Further, the verification sense amplifier 250 can amplify the cell data 'SAI' in the set state to output the sensing data 'SOB' having a low voltage level.

The verification sense amplifier 250 responds to the output of the verification sense amplifier controller 240, so the verification sense amplifier 250 can amplify voltage (i.e. cell data 'SAI'), which is changed from data (e.g. SIO voltage level) being written in the memory cell array 100, thereby providing the sensing data 'SOB'. The term 'changed data' represents data subject to a worse case when evaluating data actually written in the memory cell array 100. According to one embodiment of the present invention, the verification sense amplifier 250 can provide the sensing data 'SOB' having a more precise level by using the cell data 'SAI' under the tight conditions.

The read controller 300 is a d can include a data sense amplifier 310 and a data output buffer 320.

The data sense amplifier 310 can be configured to sense a signal loaded on the input/output line 'ISO' after being read from the memory cell array 100, and provide output data 'DOUT'.

The data output buffer 320 can be configured to buffer the output data 'DOUT' to provide the external input/output pad DQ with the output data 'DOUT'. For the purpose of convenience, the input/output lines 'SIO' of the write controller 200 and the read controller 300 are shown using separate lines. However, according to an embodiment of the present invention, the input/output lines 'SIO' may be one common input/output line.

As described above, the non-volatile semiconductor memory circuit according to an embodiment of the present invention can tightly manage sensing conditions of the verification sense amplifier 250 according to the input data 'DIN', so that resistance distribution may vary between the set state and the reset state in a predetermined section.

Figure 3:
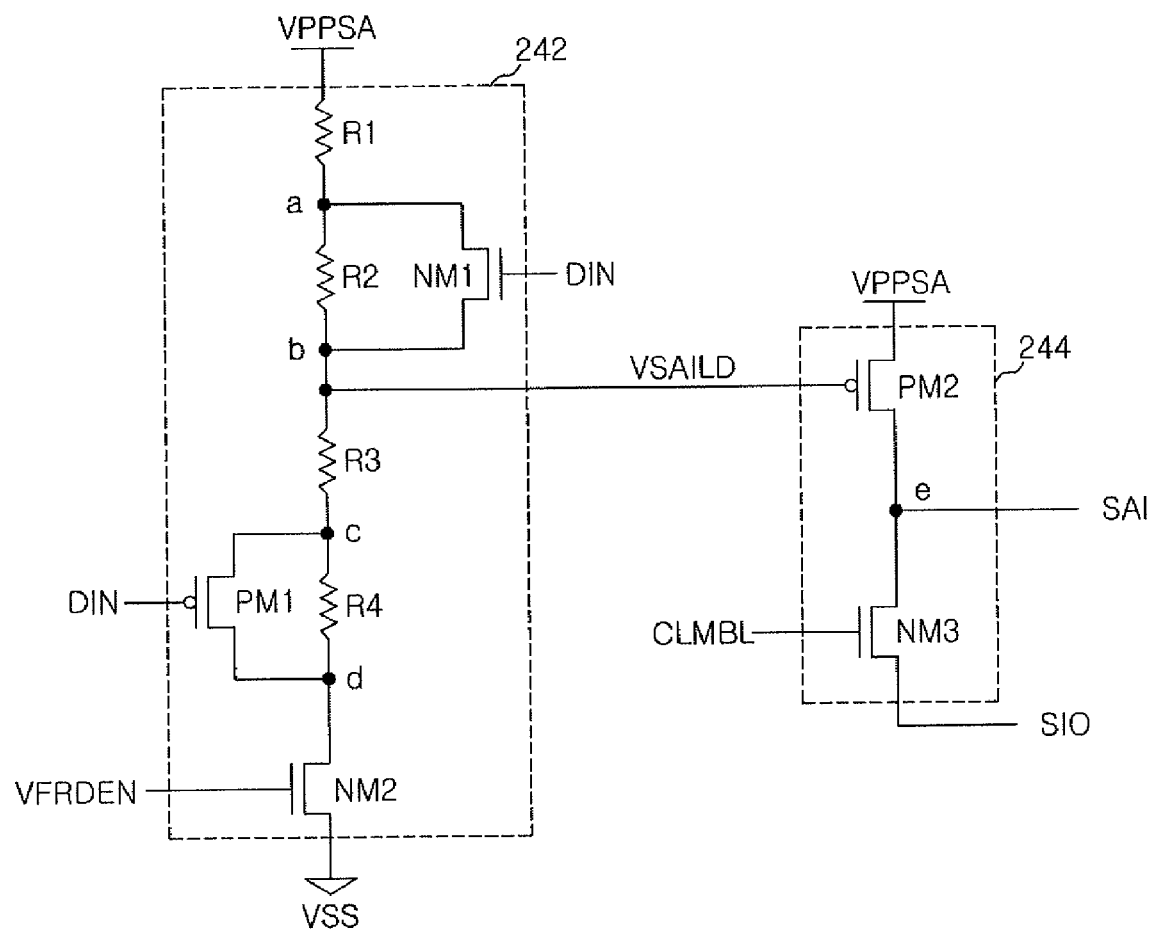
FIG. 3 is a circuit diagram showing a sense amplifier controller in FIG. 2.

FIG. 3 is a detailed circuit diagram showing the sense amplifier controller in FIG. 2.

Referring to FIG. 3, the verification sense amplifier controller 240 can include a voltage divider 242 and a cell data detector 244.

The voltage divider 242 can be configured to provide global sensing voltage 'VSAILD' having values different from each other depending on the level of the input data 'DIN'. In detail, the voltage divider 242 can provide the global sensing voltage 'VSAILD' having a new level by taking into consideration source data to be written, that is, taking into consideration the level of the input data 'DIN'. That is, if the input data 'DIN' is the set state data, the voltage divider 242 provides the global sensing voltage 'VSAILD' having a level lower than an initially precharged level. Further, if the input data 'DIN' is the reset state data, the voltage divider 242 provides the global sensing voltage 'VSAILD' having a level higher than the initially precharged level.

According to an embodiment of the present invention as shown in FIG. 3, the voltage divider 242 may include first and second NMOS transistors NM1 and NM2, a first PMOS transistor PM1, and a plurality of resistors R1 to R4. According to the embodiment shown in FIG. 3, the transistors NM1, NM2, and PM1 serve as switching devices and the plurality of resistors R1 to R4 serve as an impedance device. The voltage divider 242 including the impedance device can provide a stable voltage because the voltage divider 242 is not sensitive to temperature variation and skew variation. Further, the voltage divider 242 is provided to each input/output pad DQ in a one-to-one fashion. Accordingly, when several sense amplifiers are necessary for the same input/output pad DQ, only one voltage divider 242 is commonly used, so variation caused by process change can be reduced a device layout area can be reduced by elimination unnecessary. Therefore, according to an embodiment of the present invention, the area efficiency can be improved.

In detail, the first and second resistors R1 and R2, which are serially connected with each other, are disposed in opposition to the third and fourth resistors R3 and R4, which are serially connected with each other, about an output node 'b' of the voltage divider 242. That is, the series coupled first and second resistors R1 and R2 and the series coupled the third and fourth resistors are commonly connected to the output node 'b' of the voltage divider. The first resistor R1 is disposed in opposition to the second resistor R2 about a node 'a', and the third fourth resistor R3 is disposed in opposition to the fourth resistor R4 about a node 'c'. The first resistor R1 is provided between a sense amplifier supply voltage 'VPPSA' and the second resistor R2.

The first NMOS transistor NM1 may be configured such that a gate thereof receives the input data 'DIN', a source thereof is connected with the node 'a', and a drain thereof is connected to the node 'b'.

The first PMOS transistor PM1 may be configured such that a gate thereof receives the input data 'DIN', a source thereof is connected with the node 'c', and a drain thereof is connected to a node 'd'.

According to the above configuration, electric current can be provided from the node 'a' to the node 'b' via one of the second resistor R2, which serves as the impedance device, and the first NMOS transistor NM1, which serves as the switching device, according to the enablement of the first NMOS transistor NM1. Similarly, electric current can be provided from the node 'c' to the node 'd' via one of the fourth resistor R4, which serves as the impedance device, and the first PMOS transistor PM1, which serves as the switching device, according on the enablement of the first PMOS transistor PM1.

The second NMOS transistor NM2 may be configured such that a gate thereof receives the verification read signal 'VFRDEN', a source thereof is connected with the node 'd', and a drain thereof is connected to a ground voltage terminal supplying a ground voltage 'VSS'. The verification read signal 'VFRDEN' is activated during a write operation in response to a column main signal (not shown). The verification read signal 'VFRDEN' satisfies the scope of the present invention if the verification read signal 'VFRDEN' is an enable signal activated during the write operation.

The cell data detector 244 can be configured to provide the cell data 'SAI' by converting the electric current applied to the input/output line 'SIO' in response to the global sensing voltage 'VSAILD'. Particularly, according to an embodiment of the present invention, the cell data detector 244 can vary the amount of the electric current according to the level of the global sensing voltage 'VSAILD' thereby providing the cell data 'SAI' having a voltage level varying depending on the level of the electric current.

The cell data detector 244 can include a second PMOS transistor PM2 and a third NMOS transistor NM3.

The second PMOS transistor PM2 may be configured such that a gate thereof receives the global sensing voltage 'VSAILD', a source thereof receives the sense amplifier supply voltage 'VPPSA', and a drain thereof is connected with a node 'e'.

The third NMOS transistor NM3 may be configured such that a gate thereof receives a clamp voltage 'CLMBL', a source thereof is connected with the node 'e', and a drain thereof is connected with the input/output line 'SIO'.

The third NMOS transistor NM3 can control electrical connection between the input/output line 'SIO' and another circuit (not shown). Further, the third NMOS transistor NM3 is turned on, or enabled, in response to activation of the clamp voltage 'CLMBL' during a read operation.

Hereinafter, an operation of the verification sense amplifier controller 240 will be described.

When the verification read signal 'VFRDEN' is activated and the input data 'DIN' is in the set state, i.e., the input data 'DIN' has a low level, the first PMOS transistor PM1 is turned on.

Thus, the electric current is applied via the first to third resistors R1 to R3 and the first PMOS transistor PM1, which serves as the switching device. In general, any resistance of the switching device is considered negligible because the resistance of the switching device is very low. In this case, the global sensing voltage 'VSAILD' is divided by the first to third resistors R1 to R3 and can be calculated by Equation 1 below.

$$\text{global sensing voltage }(VSAILD) = \left(\frac{R3}{R1+R2+R3}\right) * VPPSA \quad \text{[Equation 1]}$$

During the initial read operation, when the global sensing voltage 'VSAILD' is about 1.8V, if the input data 'DIN' has the low level, values of the first to third resistors R1 to R3 are set such that the global sensing voltage 'VSAILD' is smaller than the about 1.8V level of the global sensing voltage 'VSAILD'. Thus, the second PMOS transistor PM2 supplies a greater amount of write current through the input/output line 'SIO' in response to the global sensing voltage 'VSAILD' having a level lower than a preset level, so that the level of the cell data 'SAI' is higher than the preset level.

The input data 'DIN' is under the low resistance in the set state, so the voltage (SAI) of a node, which is to be written, becomes small. As described above, in a conventional device, the input data 'DIN' of the set state may be written at a level lower than a level of data to be actually written.

However, according to an embodiment of the present invention, the input data 'DIN' in the set state can increase the level of the cell data 'SAI' by increasing the amount of the electric current applied to the memory cell array 100 of FIG. 2.

$$V = IR \quad \text{[Equation 2]}$$

In Equation 2, V denotes the voltage level of the cell data 'SAI', I denotes the write current, and R denotes a resistance.

As can be seen from Equation 2, when the amount of the write current is increased as compared to the amount of the electric current, which has been initially set, the level of the cell data 'SAI' is increased accordingly. Thus, if the cell data 'SAI' is modulated such that the level of the cell data 'SAI' can be increased, the write condition for the set data can be improved.

When the verification read signal 'VFRDEN' is activate and the input data 'DIN' is in the reset state, that is, the input data 'DIN' has a high level, the first NMOS transistor NM1 is turned on.

Thus, the electric current is applied via the first resistor R1, the first NMOS transistor NM1, which serves as the switching device, and third and fourth resistors R3 and R4. In this case, the global sensing voltage 'VSAILD' is divided by the first, third, and fourth resistors R1, R3, and R4 and can be calculated by Equation 3 below.

$$\text{global sensing voltage } (VSAILD) = \left(\frac{R3 + R4}{R1 + R3 + R4}\right) * VPPSA \quad \text{[Equation 3]}$$

During the initial read operation, when the global sensing voltage 'VSAILD' is about 1.8V, if the input data 'DIN' has the high level, the global sensing voltage 'VSAILD' has a level higher than the preset level.

Thus, the second PMOS transistor PM2 can supply a smaller amount of write current through the input/output line 'SIO' in response to the global sensing voltage 'VSAILD', having a level higher than the preset level, so that the level of the cell data 'SAI' is lower than the preset level.

The input data 'DIN' is under high resistance in the reset state, so the voltage (SAI) of a node, which is to be written, becomes large. As described above, in a conventional device, the input data 'DIN' in the reset state may be written at a level higher than a minimum level of data which is actually written.

However, according to an embodiment of the present invention, in the case of the input data 'DIN' in the reset state, the level of the cell data 'SAI' is lowered by reducing the amount of the electric current applied to the memory cell array 100 of FIG. 2.

Then, the verification sense amplifier 250 of FIG. 2 senses the cell data 'SAI' having an improved level to provide the sensing data 'SOB'. Accordingly, the sense amplifier 250 can prevent the sensing data 'SOB' from having an unclear level.

According to a conventional device, an overlap section occurs because the set data exists together with the reset data at a voltage range in the vicinity of the reference voltage 'VREF' of the verification sense amplifier 250. Thus, when data is read near the reference voltage 'VREF', set and reset states of the data may not be readily distinguished from each other, thereby degrading data reliability. However, in an embodiment of the present invention, the verification sense amplifier controller 240 can change an input low voltage 'VIL' and an input high voltage 'VIH' of the cell data 'SAI', which is input to the verification sense amplifier 250, according to the level of the input data 'DIN'. Thus, the verification sense amplifier 250 receives the cell data 'SAI' having the input low voltage 'VIL' and the input high voltage 'VIH', which vary depending on the level of the input data 'DIN'. Consequently, the verification sense amplifier 250 can sense the cell data 'SAI' having a predetermined voltage difference from the reference voltage 'VREF', which is different from the related art, so that the level of the sensing data 'SOB' output from the verification sense amplifier 250 can be clearly distinguished.

Figure 4:
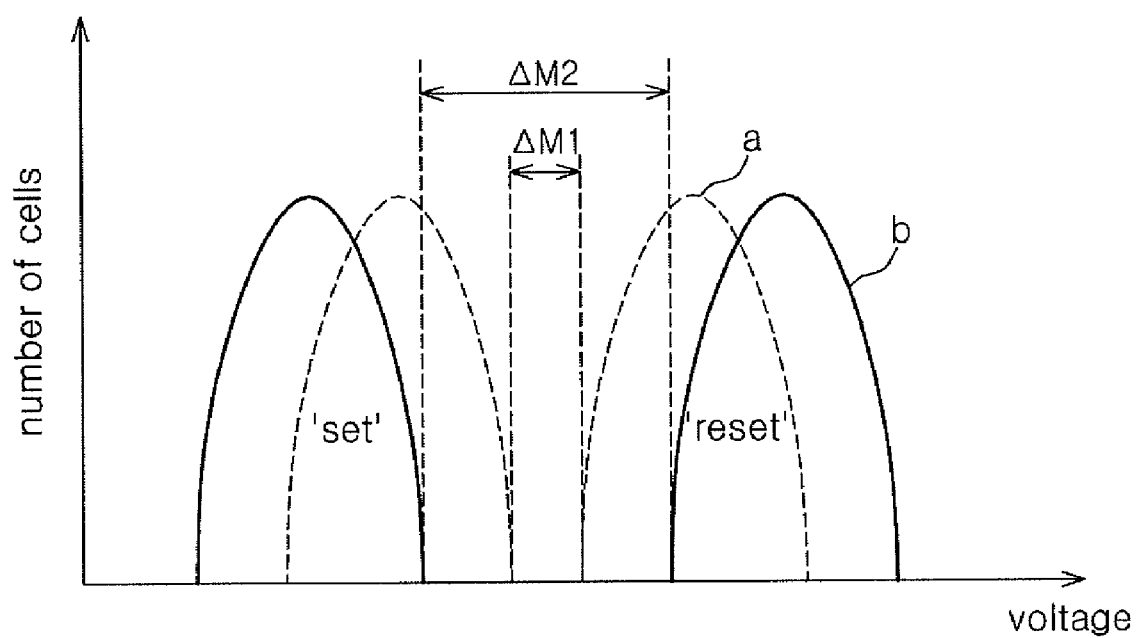
FIG. 4 is a graph showing resistance distribution of a phase change memory cell according to FIGS. 2 and 3.

FIG. 4 is a graph showing resistance distribution of data according to FIGS. 2 and 3.

Referring to FIG. 4, an X-axis denotes voltage and a Y-axis denotes the number of cells.

Dotted lines 'a' represent a set data state and a reset data state according to a conventional device. As it can be seen from the dotted lines 'a', resistance in the set state is low and represents a bell shaped normal distribution, and resistance in the reset state is high and represents the bell shaped normal distribution. Further, as shown in FIG. 4, a read margin '$\Delta M1$' between the set data state and the reset data state is small, so it is difficult to distinguish the set data from the reset data.

However, according to an embodiment of the present invention, the write conditions are reinforced according to the set data and the reset data, and data are written after repeating verification. Thus, a difference between relative values of the set data state and the reset data state, which are indicated by solid lines 'b', are increased as compared to a conventional device as described above.

In detail, in the case of the set data, voltage of the cell data 'SAI' is increased such that the set data cannot be easily written. In the case of the reset data, voltage of the cell data 'SAI' is reduced such that the reset data cannot be easily written. As it can be seen from the solid lines 'b', a maximum resistance value of the set data can be reduced and a minimum resistance value of the reset data can be increased as compared with the related art.

Thus, according to an embodiment of the present invention, a read margin '$\Delta M2$' between the set data and the reset data is increased as compared to the read margin '$\Delta M1$' the related art. Consequently, according to an embodiment of the present invention, since the width of the read margin '$\Delta M2$' is such that a section where data is not clearly distinguished (i.e., between set state/reset state) is prevented, and the reliability of a memory device is improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A non-volatile semiconductor memory circuit comprising:
  a memory cell array; and
  a verification sense amplifier controller configured to control a switching device that receives external input data according to a level of the input data such that a distribution voltage is changed when controlling a write operation by comparing the input data with cell data written in the memory cell array, so as to provide cell data,
  wherein the switching device is selected according to the level of the input data.

2. The non-volatile semiconductor memory circuit of claim 1, wherein the verification sense amplifier controller comprises:
  a voltage divider configured to provide a global sensing voltage, the level of the global sensing voltage being variable depending on the level of the input data; and
  a cell data detector configured to detect an amount of through current of the memory cell array in response to the global sensing voltage so as to provide cell data.

3. The non-volatile semiconductor memory circuit of claim 2, wherein the voltage divider comprises:
  a plurality of switching devices being serially connected; and
  a plurality of impedance devices, the plurality of impedance devices being serially connected to each other about an output node through which the cell data is output.

4. The non-volatile semiconductor memory circuit of claim 3, wherein the voltage divider is configured to control a resistance value of a current path by selectively enabling a switching device among the plurality of switching devices according to the level of the input data.

5. The non-volatile semiconductor memory circuit of claim 2, wherein the voltage divider is configured to voltage-divide the input data to provide the global sensing voltage having a first level when the input data is in a set state, and
  configured to voltage-divide the input data to provide the global sensing voltage having a second level when the input data is in a reset state.

6. The non-volatile semiconductor memory circuit of claim 5, wherein a voltage value of the first level is less than a voltage value of the second level.

7. The non-volatile semiconductor memory circuit of claim 2, wherein the cell data detector is configured to provide the cell data at a second level when the input data is in a set state, and to provide the cell data at a first level when the input data is in a reset state.

8. The non-volatile semiconductor memory circuit of claim 7, wherein a voltage value of the first level is less than a voltage value of the second level.

9. A non-volatile semiconductor memory circuit comprising:
  a memory cell array including a phase change random access memory (PRAM) cell;
  a verification sense amplifier controller configured to adjust a predetermined voltage of an input/output line connected to the memory cell array so as to provide cell data; and
  a verification sense amplifier configured to sense a level of the cell data, the level of the cell data varying depending on a current applied to the memory cell in a write mode,
  wherein a voltage distribution rate of the predetermined voltage of the verification sense amplifier controller is directly adjusted according to a level of an external input data.

10. The non-volatile semiconductor memory circuit of claim 9, wherein the verification sense amplifier controller is configured to vary a voltage of the cell data by controlling amount of current applied from an input/output line to the memory cell, depending on the level of external input data.

11. The non-volatile semiconductor memory circuit of claim 10, wherein the verification sense amplifier controller comprises:
  a voltage divider configured to provide a global sensing voltage, the level of the global sensing voltage being variable depending on the level of the input data; and
  a cell data detector configured to detect an amount of through current of the memory cell in response to the global sensing voltage so as to provide the cell data.

12. The non-volatile semiconductor memory circuit of claim 11, wherein the voltage divider comprises:
  a plurality of serially connected switching devices; and
  a plurality of serially connected impedance devices.

13. The non-volatile semiconductor memory circuit of claim 12, wherein the voltage divider is configured to vary a distribution voltage by selectively controlling the switching devices depending on the level of the input data.

14. The non-volatile semiconductor memory circuit of claim 11, wherein the voltage divider is configured to voltage-divide the input data to provide the global sensing voltage having a first level when the input data is in a set state, and
  to voltage-divide the input data to provide the global sensing voltage having a second level when the input data is in a reset state.

15. The non-volatile semiconductor memory circuit of claim 14, wherein a voltage value of the first level is less than a voltage value of the second level.

16. The non-volatile semiconductor memory circuit of claim 11, wherein the cell data detector comprises:
  a switching device configured to control an amount of a driven current depending on a level of the global sensing voltage.

17. The non-volatile semiconductor memory circuit of claim 16, wherein the cell data detector is configured to voltage-divide the input data to provide the global sensing voltage having a first level when the input data is in a set state, and
  configured to voltage-divide the input data to provide the global sensing voltage having a second level when the input data is in a reset state.

18. The non-volatile semiconductor memory circuit of claim 17, wherein a voltage value of the first level is less than a voltage value of the second level.

19. The non-volatile semiconductor memory circuit of claim 9, wherein the verification sense amplifier is configured to sense the cell data on according to a sensing reference voltage so as to provide sensing data.

20. The non-volatile semiconductor memory circuit of claim 19, further comprising:
  a comparator configured to determine a write operation by comparing the input data with the sensing data.

21. A non-volatile semiconductor memory circuit comprising:
  a memory cell array; and
  a write controller configured to compare external input data with sensing data, and verify the sensing data while varying cell data sensed from the memory cell array depending on a level of the external input data, the level of the external input data serving as a target level.

22. The non-volatile semiconductor memory circuit of claim 21, wherein the write controller is configured to increase an input low voltage of the cell data as compared with a predetermined value when the input data is in a set state, and
configured to lower an input high voltage of the cell data as compared with a predetermined value when the input data is in a reset state.

23. The non-volatile semiconductor memory circuit of claim 21, wherein the write controller is configured to control an amount of current provided to the memory cell array using a distribution voltage generated according to the level of the input data.

24. The non-volatile semiconductor memory circuit of claim 23, wherein the write controller is configured to verify whether the input data coincides with the cell data by sensing a level of the cell data varying according to a current applied to the memory cell array.

25. A non-volatile semiconductor memory circuit comprising:
a memory cell array; and
a write controller configured to vary voltage of cell data according to controlling the amount of write current applied to the memory cell array by adjusting a distribution voltage depending on a level of the input data when controlling a write operation by comparing external input data and cell data written in the memory cell array.

26. The non-volatile semiconductor memory circuit of claim 25, wherein the write controller comprises:
a verification sense amplifier controller configured to provide the cell data by controlling amount of write current provided to the memory cell array depending on the level of the input data; and
a verification sense amplifier configured to receive the cell data and a sensing reference voltage to provide sensing data.

27. The non-volatile semiconductor memory circuit of claim 26, wherein the verification sense amplifier controller comprises:
a voltage divider configured to provide a global sensing voltage, the level of the global sensing voltage being variable by controlling intensity of distribution voltage depending on the level of the input data; and
a cell data detector configured to detect an amount of current provided to the memory cell array in response to the global sensing voltage so as to provide the cell data.

28. The non-volatile semiconductor memory circuit of claim 27, wherein the voltage divider is configured to voltage-divide the input data to provide the global sensing voltage having a first level when the input data is in a set state, and
configured to voltage-divide the input data to provide the global sensing voltage having a second level when the input data is in a reset state.

29. The non-volatile semiconductor memory circuit of claim 28, wherein a voltage value of the first level is less than a voltage value of the second level.

30. The non-volatile semiconductor memory circuit of claim 27, wherein the cell data detector is configured to provide the cell data having a second level when the input data is in a set state, and
configured to provide the cell data having a first level when the input data is in a reset state.

31. The non-volatile semiconductor memory circuit of claim 30, wherein a voltage value of the first level is less than a voltage value of the second level.

32. The non-volatile semiconductor memory circuit of claim 25, wherein the memory cell array comprises a phase change random access memory (PRAM) cell.

* * * * *